United States Patent [19]
Karczewski et al.

[11] Patent Number: 5,507,015
[45] Date of Patent: Apr. 9, 1996

[54] METHOD AND APPARATUS FOR AUTOMATIC MODULATION CALIBRATION IN A RADIO TRANSMITTER

[75] Inventors: Casimir Karczewski, Lake Villa; Paul Christian, Crystal Lake, both of Ill.

[73] Assignee: Motorola, Inc.

[21] Appl. No.: 203,124

[22] Filed: Feb. 28, 1994

[51] Int. Cl.$^6$ .............. H04B 1/04; H01Q 11/12
[52] U.S. Cl. .............. 455/116; 455/126; 455/127
[58] Field of Search .............. 375/254, 296; 455/113, 115–117, 119, 126–127, 67.1, 67.4, 67.7; 332/123, 126, 127, 159–161

[56] References Cited

U.S. PATENT DOCUMENTS 5,170,495  12/1992  McNicol .............. 455/126
5,204,881   4/1993  Cardini et al. .............. 375/296
5,351,016   9/1994  Dent .............. 332/123

Primary Examiner—Reinhard J. Eisenzopf
Assistant Examiner—Thanh Le
Attorney, Agent, or Firm—Charles W. Bethards

[57] ABSTRACT

In a transmitter (100), circuitry is employed to automatically calibrate errors in a modulated carrier signal. A generator (320) is activated to generate (510) a low frequency square wave for use as data, which is used to generate a modulating signal from which the modulated carrier signal is generated. The modulated carrier signal is down-converted to an intermediate frequency (IF) signal having a steady state IF signal level. The instantaneous IF signal level is compared (545) to the steady state IF signal level to determine (550) whether the instantaneous IF signal level differs from the steady state IF signal level by greater than a predetermined amount, and, when the instantaneous IF signal level differs from the steady state IF signal level by greater than the predetermined amount, the modulating signal is adjusted (560).

14 Claims, 4 Drawing Sheets

5,507,015

METHOD AND APPARATUS FOR AUTOMATIC MODULATION CALIBRATION IN A RADIO TRANSMITTER

FIELD OF THE INVENTION

This invention relates in general to radio transmitters, and more specifically to modulation calibration.

BACKGROUND OF THE INVENTION

Radio transmitters are utilized to transmit information over the air. This is typically accomplished by modulating a carrier signal with an information signal. For amplitude modulated signals, the amplitude of the carrier signal varies with the amplitude of the information signal. Alternatively, for frequency modulated signals, the frequency of the carrier signal varies with the frequency of the information signal. Typically, in frequency modulation schemes, a phase locked loop (PLL) is employed with a fixed reference frequency signal, perhaps provided by a crystal oscillator, to synthesize the carrier frequency. The voltage controlled oscillator (VCO) of the PLL is directly modulated by the information signal to result in the modulated carrier, which is then provided to an antenna for transmission over the air.

In systems requiring DC response, that is when the information signal contains very low frequency components, the reference frequency signal is also modulated with an additional signal then provided to the PLL. This additional signal varies with the information to be transmitted and is employed to compensate for the non-DC response of the PLL. In other words, the use of the additional signal prevents the PLL from tracking out the information signal when the information signal is low in frequency.

A common problem resulting from the use of an additional signal to prevent the PLL from correcting out the information signal, however, is that mismatch can occur between the additional signal and the information signal. This mismatch generally occurs as a result of amplitude variations in the information signal and differential delay variations between the information signal and the additional signal and causes instantaneous overshoot and undershoot on the modulated carrier. When the overshoot and undershoot are great, radio devices for receiving the transmitted carrier signal cannot reliably decode the signal, causing signals to be erroneously received or missed entirely. Therefore, external calibration equipment must be used to periodically calibrate the modulated carrier. In high data rate systems however, only very accurate, and therefore expensive, calibration equipment can detect the errors which result from the overshoot and undershoot. This expense is reflected both in the cost and complexity of the transmitting devices, resulting in higher priced transmitting systems and system service.

Thus, what is needed is a method and apparatus for correcting errors in the modulated carrier of a transmitting device without the use of expensive external calibration equipment.

SUMMARY OF THE INVENTION

In a transmitter, a method and apparatus are employed for automatically calibrating errors in a modulated carrier signal. A generator is activated to generate a low frequency square wave for use as data, the modulated carrier signal is generated from a modulating signal and the data. The modulated carrier signal is down-converted to an intermediate frequency (IF) signal having a steady state IF signal level. The instantaneous IF signal level is compared to the steady state IF signal level to determine whether the instantaneous IF signal level differs from the steady state IF signal level by greater than a predetermined amount, and, when the instantaneous IF signal level differs from the steady state IF signal level by greater than the predetermined amount, the modulating signal is adjusted.

According to another aspect of the present invention, a method for calibrating errors in a modulated carrier signal generated by a transmitter comprises the steps of receiving data to be transmitted and generating a modulating signal which is modulated with a reference frequency signal to generate the modulated carrier signal, wherein the modulating signal is dependent upon the data and at least one variable. The modulated carrier signal is down-converted to an intermediate frequency (IF) signal, and the instantaneous IF signal level is compared to a previously stored value indicative of the steady state IF signal level. When it is determined that the instantaneous IF signal level differs from the previously stored value indicative of the steady state IF signal level by greater than a predetermined amount, the variable is adjusted.

According to still another aspect of the present invention, a transmitter for automatically calibrating erroneous modulated carrier signals comprises a memory for storing variables, a controller for generating transmit data responsive to received data and a first of the variables, a mixer coupled to the controller for multiplying the transmit data with a second of the variables to generate a modulating signal, and a signal generator for generating a correction signal from the transmit data. A first phase-locked loop (PLL) utilizes the correction signal and the modulating signal to generate a modulated carrier signal for transmission over the air, and a second PLL and a mixer down-convert the modulated carrier signal to an intermediate frequency (IF) signal. A monitoring circuit compares an instantaneous IF signal level relative to a previously stored value indicative of a steady state IF signal level to determine whether the instantaneous IF signal level differs from the steady state IF signal level by greater than a predetermined amount, and the controller calibrates at least one of the variables to compensate for error in response to the determination that the instantaneous IF signal level differs from the steady state IF signal level by greater than a predetermined amount.

DESCRIPTION OF A PREFERRED EMBODIMENT

Figure 1:
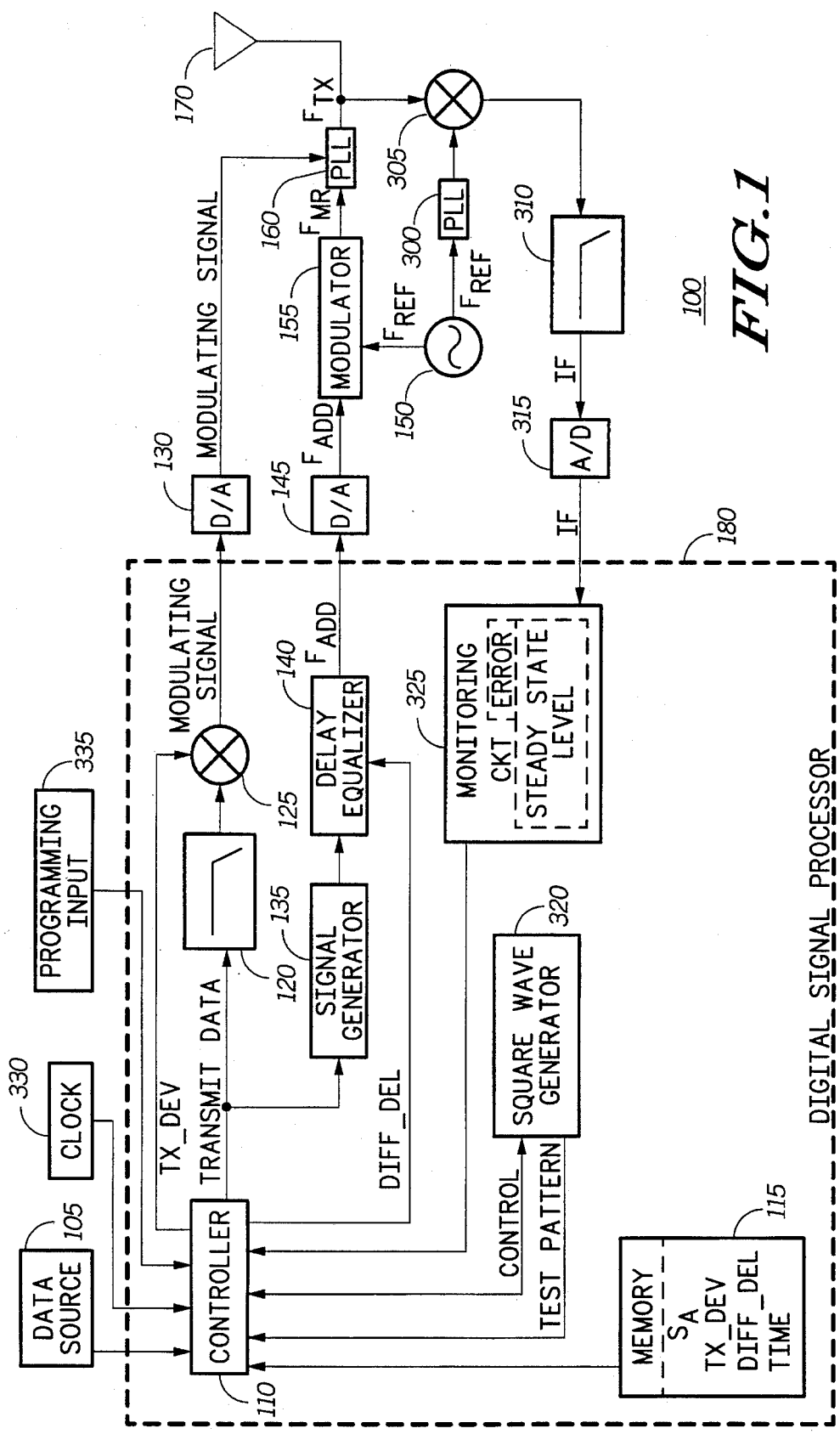
FIG. 1 is an electrical block diagram of a transmitter including internal calibration circuitry in accordance with the present invention.

FIG. 1 is an electrical block diagram of a radio transmitter 100 for transmitting signals over the air for reception by receiving devices, such as pagers (not shown). The transmitter 100 preferably comprises a data source 105, which can be, for example, a port for receiving data from another device or a keyboard by which a user can enter information. Alternatively, the source 105 can be internal to the transmitter 100 when the transmitter 100 generates its own data. The data source 105 is coupled to a controller 110 for receiving the data. Further coupled to the controller 110 is a memory 115 for storing variables comprising a differential delay variable (DIFF_DEL), a transmit deviation variable (TX_DEV), and a signal amplitude variable ($S_A$). Upon reception of the data, the controller 110 determines whether the incoming bit is low or high. When the data bit is low, the controller 110 outputs $-S_A$, and, when the data bit is high, the controller 110 outputs $+S_A$.

The transmitter 100 further comprises a digital filter 120, a mixer 125, and a digital-to-analog (D/A) converter 130 which form a first signal path along which a modulating signal is provided. A signal generator 135, a delay equalizer 140, and another D/A converter 145 form a second signal path along which a second signal, $F_{ADD}$, is provided. Further included within the transmitter 100 is a reference frequency generator 150, such as a crystal oscillator, for providing a fixed reference frequency signal. A modulator 155 coupled to the reference frequency generator 150 and to the second D/A converter 145 modulates the reference frequency signal with $F_{ADD}$ to produce a modulated reference frequency signal, $F_{MR}$, in a conventional manner. A conventional phase-locked loop (PLL) coupled to the modulator 155 and the first D/A converter 130 then processes FMR and the modulating signal to generate a modulated carrier signal $F_{TX}$ that deviates in either a positive or a negative direction from a center frequency $F_C$ depending upon the frequency of $F_{ADD}$ and the amplitude of the modulating signal. An antenna 170 coupled to the output of the PLL 160 radiates the modulated carrier signal over the air for reception by receiving devices included within the communication system of the transmitter 100.

The controller 110, memory 115, filter 120, signal generator 135, and delay equalizer 140 can be implemented, for example, by using a digital signal processor 180, such as a DSP56002 digital signal processor manufactured by Motorola, Inc. The D/A converters 130 and 145 can be implemented using Model No. 190 converters manufactured by Maxim. The reference frequency generator 150 can be implemented using a Model No. KXN-1096A generator manufactured by Motorola, Inc.

As mentioned briefly hereinabove in the Background of the Invention, the signal $F_{ADD}$ is not always necessary when the modulating signal is high frequency. However, when the frequency of the modulating signal is low, the PLL 160 would, without $F_{ADD}$, attempt to correct out the modulating signal. The use of the signal $F_{ADD}$, which handles the low frequency response of the PLL 160, prevents the PLL 160 from tracking out the modulating signal in a manner well known to one of ordinary skill in the art. The modulator 155, along with the calculation and generation of the signal $F_{ADD}$, are described in greater detail in U.S. patent application Ser. No. 08/051,401, entitled "Method and Apparatus for Digital Modulation Using Pulse Addition", which is assigned to the assignee hereof and which is hereby incorporated by reference.

Although the use of both the modulating signal and $F_{ADD}$ prevents the PLL 160 from correcting out the modulating signal, mismatch between the two signals can cause undesirable perturbations in the modulated carrier signal, $F_{TX}$. Mismatch between the two signals is caused by amplitude variations and by differential delay variations between the modulating signal and $F_{ADD}$.

Figure 2:
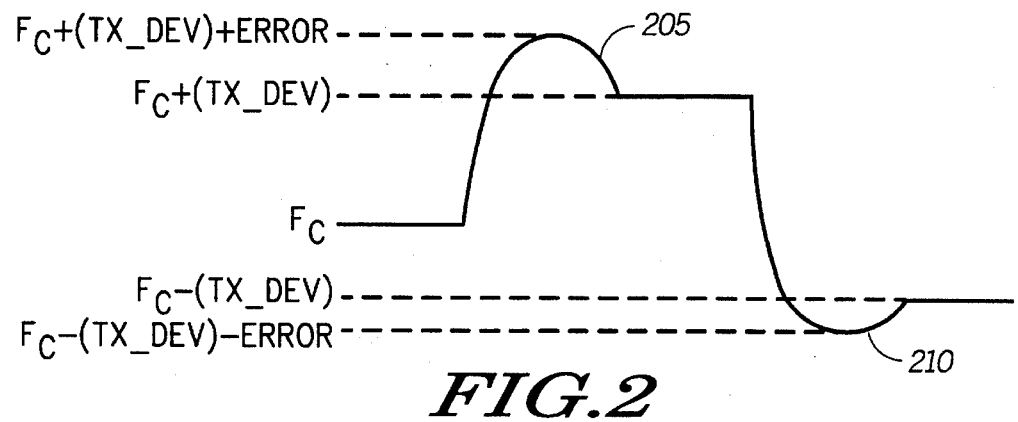
FIG. 2 is a signal diagram illustrative of amplitude variation error introduced into the modulated carrier signal of the transmitter of FIG. 1 in accordance with the present invention.

Amplitude variations occur when variations in the hardware cause instantaneous error in $F_{TX}$. While the long term steady state modulated carrier signal will be governed by $F_{ADD}$ and will be therefore be correct, the instantaneous modulated carrier signal will include error, as illustrated in FIG. 2. FIG. 2 is a signal diagram depicting an example of the instantaneous error in the modulated carrier signal when amplitude variations in the hardware are present. As shown, the modulated carrier signal includes an overshoot 205 when the deviation of the carrier is positive and an undershoot 210 when the deviation of the carrier is negative.

Figure 3:
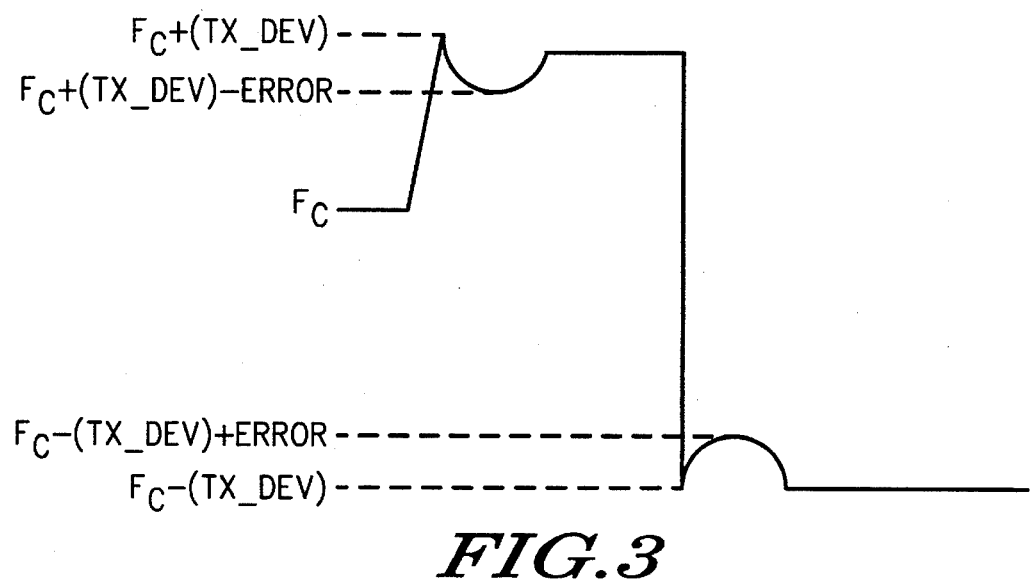
FIG. 3 is a signal diagram illustrative of differential delay error introduced into the modulated carrier signal of the transmitter of FIG. 1 in accordance with the present invention.

Differential delay error, an example of which is illustrated in FIG. 3, occurs when the transitions of the modulating signal do not occur at the same instant as transitions between $+F_{ADD}$ and $-F_{ADD}$. As shown, undershoot and overshoot in the modulated carrier, $F_C \pm TX\_DEV$, are caused by the differential delay error, $\Delta_e$.

In conventional transmitters, errors caused by differential delay and amplitude variations can result in transmitted signals that cannot be decoded by receiving devices when the signals are transmitted at high baud rates. Therefore, the errors in the modulated carriers must, in conventional transmitters, be calibrated periodically using conventional external calibration equipment, which is often very expensive.

In the transmitter 100, conversely, internal calibration circuitry is employed to automatically compensate for mismatch errors in accordance with the present invention without the use of external calibration equipment. Returning to FIG. 1, the transmitter 100 further comprises a square wave generator 320 which is activated, via a control line, by the controller 110 at predetermined times. The square wave generator 320, when activated, preferably generates an alternating pattern of 1's and 0's at a very low baud rate, for example 10 bps. The square wave generator is used as an alternate to data source 105 for the purpose of generating a test pattern that results in the signal FTX as described above. It will be appreciated that, in general, it is undesirable to transmit the signal FTX that results from the test pattern, so, when the square wave generator 320 is activated, the transmission of the signal FTX is preferably disabled. This can easily be accomplished, for example, by utilizing a switch (not shown) between the PLL 160 and the antenna 170, wherein the switch is controlled by the controller 110 such that only desirable signals are transmitted.

The transmitter 100 also includes a PLL 300, a mixer 305, and a filter 310 for converting the modulated carrier, $F_{TX}$, to an intermediate frequency (IF) signal which can be, for example, on the order of 50 kHz. An analog-to-digital (A/D) converter 315 is coupled to the output of the filter 310 for converting the IF signal to digital samples which can be examined by digital signal processor 180. A monitoring circuit 325, further included within the transmitter 100, measures the voltage difference between the peak instantaneous overshoot or undershoot in the IF signal and the long term steady state level of the IF signal. The monitoring circuit 325 thereafter preferably generates one of five possible outputs that indicates to the controller 110 any adjustments that should be made to the variables $S_A$ or DIFF_DEL. In accordance with the present invention, an "adjustment" signal is only provided to the controller 110 when the error of the IF signal is greater than a predetermined amount, such as 15 Hz.

Figure 4:
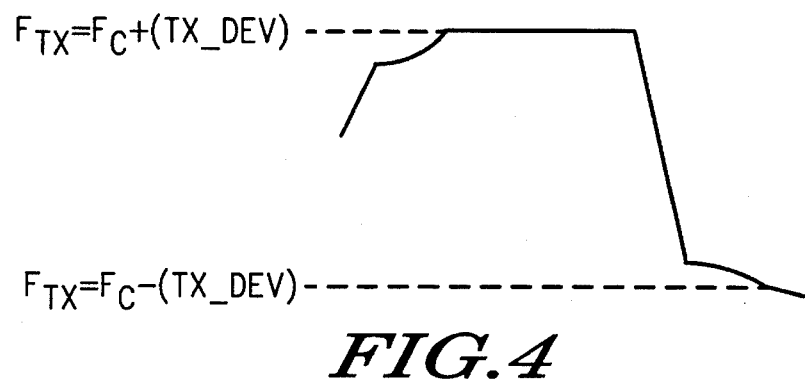
FIGS. 4–7 are signal diagrams depicting erroneous signals that are provided to a processor of the transmitter of FIG. 1 in accordance with the present invention.
Figure 5:
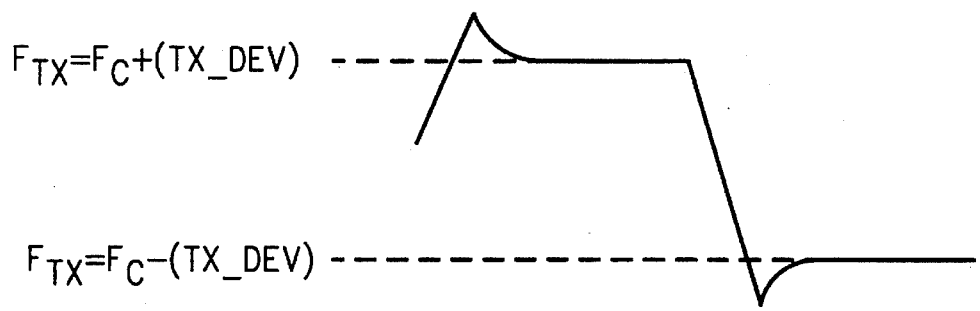
Figure 6:
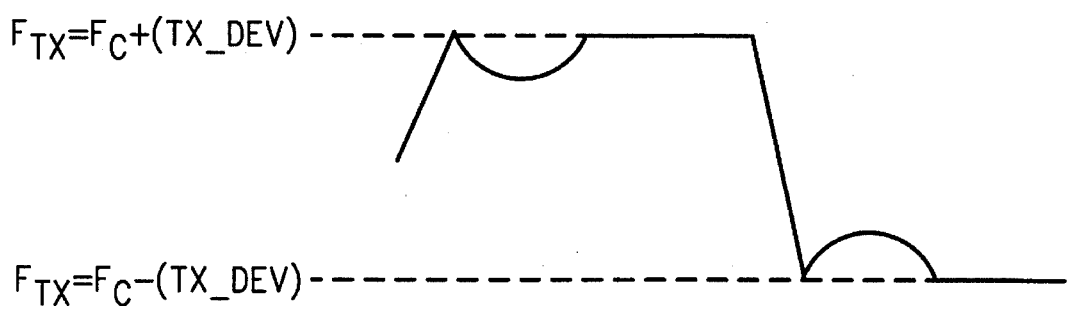
Figure 7:
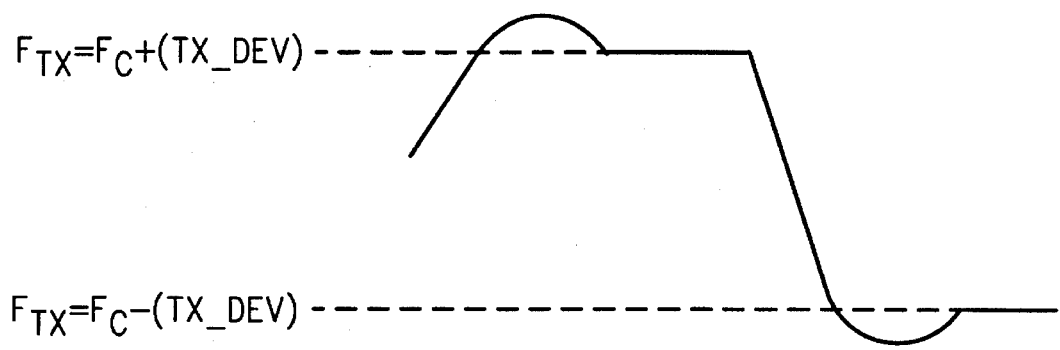

Referring next to FIGS. 4–7, signal diagrams illustrate erroneous IF signals that could be received by the monitoring circuit 325. FIG. 4, for example, illustrates an IF signal that, when the undershoot and overshoot are greater than 15 Hz, will cause the monitoring circuit 325 to generate a first adjustment signal indicating that $S_A$ should be increased. In response to reception of the signal of FIG. 5, the monitoring circuit output indicates that $S_A$ should be decreased when the error is greater than 15 Hz. The signals of FIGS. 6 and 7, when the error is greater than 15 Hz, will result in monitoring circuit outputs indicating that the variable DIFF__DEL should be increased and decreased, respectively. When the error of the IF signal is less than 15 Hz, the monitoring circuit 325 generates a fifth output indicating that the current values of $S_A$ and DIFF__DEL are acceptable and need no adjustments at the present time.

The monitoring circuit 325 and the square wave generator 320 can also be included within the digital signal processor 180. The A/D converter 315 can be implemented using the 56ADC16 converter manufactured by Motorola, Inc. The two PLLs 160, 300, the mixer 305, and the filter 310 can be implemented, for instance, using an MC145170 chip manufactured by Motorola, Inc. and model no. TTD1732A voltage controlled oscillators, also manufactured by Motorola, Inc.

Preferably, the controller 110 begins the calibration process upon power up of the transmitter 100. However, in an alternate embodiment of the present invention, the transmitter 100 can further include a clock 330 which generates time values from which the instantaneous time of day can be determined and a programming input 335, such as a keypad, for receiving a time variable, TIME, which is stored in the memory 115. When the variable TIME is equivalent to the instantaneous time of day, the controller 110 activates the square wave generator 320 to calibrate the mismatch between $F_{ADD}$ and the modulating signal. In this alternate embodiment, a human operator can program the transmitter 100 to calibrate itself as often as necessary. Furthermore, this calibration time can be conveniently and simply reprogrammed to account for component aging and other factors affecting the mismatch error.

Additionally, in accordance with another alternate embodiment of the present invention, the comparison process of the monitoring circuit 325 can be continuously performed on normal system data, thereby eliminating the need to invoke a specific calibration process once the steady state IF signal level has already been determined. In this case, the monitoring circuit 325 stores the value of the long term steady state IF signal level measured at transmitter power up when the transmitter 100 is first calibrated. Thereafter, as normal system data from the data source 105 is modulated onto carrier $F_{TX}$, the monitoring circuit 325 continuously measures the instantaneous overshoot or undershoot IF signal level relative to the stored value of the long term steady state IF signal level. When the instantaneous IF signal level is seen to differ from the stored steady state IF signal level by more than a predetermined amount, the monitoring circuit 325 sends adjustment signals to controller 110 as described above in reference to FIGS. 4–7.

It will be appreciated that the transmitter 100 according to the present invention advantageously includes internal calibration circuitry for automatically calibrating the mismatch between the modulating signal and $F_{AAD}$. As a result, the transmitter 100 does not require the use of external calibration circuitry to periodically calibrate the mismatch, and the calibration can therefore be accomplished without temporarily disabling the transmitter 100. Furthermore, because the internal calibration of the transmitter 100 is accomplished using conventional, off-the-shelf parts, using of the transmitter 100 is less expensive than using a conventional transmitter that requires calibration by very expensive external equipment. The cost of the transmitter 100 is reduced still further when it is taken into consideration that human intervention is not required to calibrate the transmitter 100 since the calibration can be automatically performed at certain times, such as at power up, or continuously on normal system data.

Figure 8:
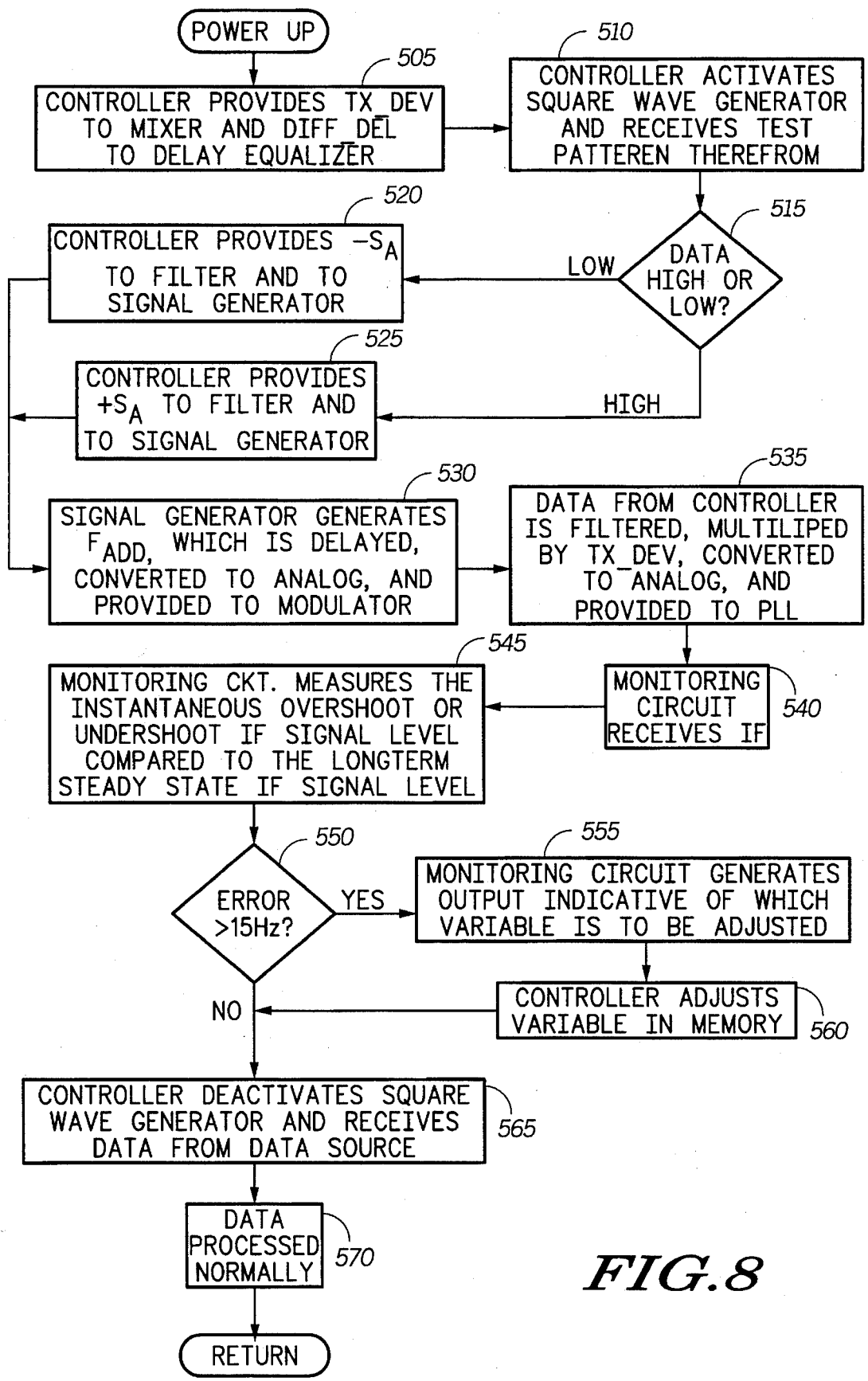
FIG. 8 is a flowchart of the operation of the processor of FIG. 1 in accordance with the present invention.

FIG. 8 is a flowchart that illustrates the operation of the digital signal processor 180 upon power up to calibrate the transmitter 100. At step 505, upon power up, the controller 110 (FIG. 1) provides the variables TX_DEV and DIFF__DEL to the mixer 125 and to the delay equalizer 140, respectively. The controller 110 then activates, at step 510, the square wave generator 320 to receive the test pattern therefrom. Next, the controller 110 determines, at step 515, whether the incoming data bit from the square wave generator 320 is high or low. When the data bit is low, the controller 110, at step 520, retrieves the variable $S_A$ from the memory 115 (FIG. 1) and provides $-S_A$ to the filter 120 and the signal generator 135. When, alternatively, the data bit is high, the controller 110, at step 525, provides $+S_A$ to the filter 120 and the signal generator 135. Thereafter, at step 530, the signal generator 135 generates one of two possible $F_{ADD}$ signals, depending upon the sign of $S_A$. $F_{ADD}$ is then delayed by DIFF__DEL and provided to the D/A converter 140. Coincidentally, at step 535, the filtered $S_A$ is mixed with the variable TX_DEV to generate the modulating signal, which is provided to the D/A converter 130.

The analog $F_{ADD}$ and analog modulating signal are then processed, as described above in reference to FIG. 1, by the modulator 155 and the PLL 160 to produce the modulated carrier signal $F_{TX}$, which is also supplied to the mixer 305 for down-conversion to the IF signal.

When, at step 540, the monitoring circuit 325 receives the sampled IF signal, the monitoring circuit 325 measures, at step 545, the instantaneous overshoot or undershoot IF signal level relative to the long term steady state IF signal level. When, at step 550, the error in the instantaneous IF signal level is less than a predetermined amount, e.g., 15 Hz, no adjustment in the stored variables is made. When, on the other hand, the error in the IF signal is greater than 15 Hz, the monitoring circuit 325 outputs, at step 555, one of four error signals indicating to the controller 110 which variable is to be adjusted and whether it is to be increased or decreased, as mentioned above, and the controller 110 makes the appropriate adjustment in either $S_A$ or DIFF__DEL, at step 560. Thereafter, at step 565, the controller 110 deactivates the square wave generator 320 and receives data from the data source 105. This data is processed normally and preferably transmitted.

When the data is to be continuously monitored for calibration, rather than calibrating only at power up, the digital signal processor 180 follows essentially the same operation as that set forth as described in FIG. 8. Additionally, however, the monitoring circuit 325, when examining the IF signal, stores the long term steady state IF signal level, as shown in FIG. 1. Calibration occurs as described in FIG. 8 then, once the controller 110 is receiving data from the data source 105, the monitoring circuit 325 continually measures the instantaneous overshoot or undershoot of the IF signal generated from the data from the data source 105. This measurement is performed using the stored long term steady state IF signal level for accuracy. The monitoring circuit 325, by signalling the controller 110, can conveniently effect the constant updating of variables in the memory 115 such that the transmitted signal can always be detected by receiving devices within the signal.

In summary, the transmitter described above conveniently includes circuitry for down-converting the modulated carrier signal to an IF signal that is examined to determine whether the IF signal is erroneous due to mismatch in $F_{ADD}$ and the modulating signal. When error is present, variables used in generating $F_{ADD}$ and the modulating signal are automatically adjusted to reduce the mismatch and thereby compensate for the error in the modulated carrier signal. Therefore, situations are avoided in which the modulated carrier includes such a large amount of error that pagers within the system are unable to decode the transmitted signal.

Although conventional transmitters can be calibrated to reduce the mismatch, the conventional transmitters must be calibrated using external calibration equipment that is very expensive. This cost is traditionally passed on to the consumer in higher priced transmitters, pagers, and paging service. Furthermore, because the calibration equipment for use with conventional transmitters is typically large and not easily transported, conventional transmitters may be calibrated less frequently, resulting in greater error that can cause pagers to "miss" pages transmitted by the conventional transmitters.

The transmitter according to the present invention, on the other hand, can be conveniently programmed to automatically calibrate the mismatch between $F_{ADD}$ and the modulating signal at predetermined times without human intervention. As a result, the mismatch can be easily calibrated frequently enough that errors do not become so great that the receivers have difficulty decoding the transmitted signals.

Additionally, the transmitter according to the present invention can be programmed to continuously monitor the IF signal to automatically compensate for undesirable perturbations in the modulated carrier signal as they occur on normal system data.

It will be appreciated by now that there has been provided a method and apparatus for calibrating erroneous modulated carrier signals without resorting to expensive, bulky external calibration equipment that may not be accurate enough to detect the error.

What is claimed is:

1. A method, in a transmitter, for automatically calibrating errors in a modulated carrier signal, the method comprising the steps of:

determining that the transmitter is to be calibrated by comparing a time variable stored in a memory to an instantaneous time of day;

activating a generator to generate a low frequency square wave for use as data;

generating the modulated carrier signal from a modulating signal and the data;

down-converting the modulated carrier signal to an intermediate frequency (If) signal having steady state IF signal level;

comparing an instantaneous IF signal level to the steady state IF signal level to determine whether the instantaneous IF signal level differs from the steady state IF signal level by greater than a predetermined amount, wherein said activating the generator and said comparing the instantaneous IF signal level to the steady state IF signal level occur in response to determining that the time variable is equivalent to the instantaneous time of day; and adjusting the modulating signal when the instantaneous IF signal level differs from the steady state IF signal level by greater than the predetermined amount.

2. A method, in a transmitter, for automatically calibrating errors in a modulated carrier signal, the method comprising the steps of:

activating a generator to generate a low frequency square wave for use as data;

generating the modulated carrier signal from a modulating signal and the data;

down-converting the modulated carrier signal to an intermediate frequency (IF) signal having a steady state IF signal level;

storing a value indicative of the steady state IF signal level in memory;

deactivating the generator;

receiving the data from a data source;

comparing an instantaneous IF signal level to the value stored in the memory to determine whether the instantaneous IF signal level differs from the steady state IF signal level by greater than a predetermined amount; and adjusting the modulating signal when the instantaneous IF signal level differs from the steady state IF signal level by greater than the predetermined amount.

3. A method for calibrating errors in a modulated carrier signal generated by a transmitter, the method comprising:

receiving data to be transmitted;

generating a modulating signal which is modulated with a reference frequency signal to generate the modulated carrier signal, wherein the modulating signal is dependent upon the data and at least one variable;

down-converting the modulated carrier signal to an intermediate frequency (IF) signal;

comparing an instantaneous IF signal level to a previously stored value indicative of a steady state IF signal level to determine whether the instantaneous IF signal level differs from the previously stored value indicative of the steady state IF signal level by greater than a predetermined amount; and adjusting at least one variable in response to determining that the instantaneous IF signal level differs from previously stored value by greater than the predetermined amount.

4. The method according to claim 3, further comprising, prior to the down-converting step, the step of:

determining that a calibration time has arrived.

5. The method according to claim 4, further comprising the step of:

programming the transmitter with a time variable that is stored in a memory.

6. The method according to claim 5, wherein the determination of the calibration time comprises the steps of:

comparing the time variable with an instantaneous time of day; and determining that the calibration time has arrived when the time variable is equivalent to the instantaneous time of day.

7. A transmitter for automatically calibrating errors in a modulated carrier signal, the transmitter comprising:

determining means for determining when a calibration time has arrived, comprising a clock for generating values indicative of an instantaneous time of day, a memory for storing a time variable, and time comparing means for determining that the calibration time has arrived when the time value is equivalent to the instantaneous time of day;

activating means for activating, responsive to the determination that the calibration time has arrived, a generator to generate a low frequency square wave for use as data;

modulating means coupled to the activating means for generating the modulated carrier signal from a modulating signal and the data;

conversion means coupled to the modulating means for down-converting the modulated carrier signal to an intermediate frequency (IF) signal having a steady state IF signal level;

monitoring means coupled to the conversion means for comparing an instantaneous IF signal level to the steady state IF signal level to determine whether the instantaneous IF signal level differs from the steady state IF signal level by greater than a predetermined amount; and adjusting means coupled to the monitoring means for adjusting the modulating signal when the instantaneous IF signal level differs from the steady state IF signal level by greater than the predetermined amount.

8. The transmitter of claim 7, further comprising programming means coupled to the memory for receiving the time value from a user and storing the time value in the memory.

9. The transmitter of claim 7, wherein the conversion means comprises a PLL and a mixer for converting the modulated carrier signal to the IF signal with reference to the reference frequency signal.

10. The transmitter of claim 7, wherein the monitoring means comprises a monitoring circuit, and the adjusting means comprises a controller.

11. The transmitter of claim 7, wherein the monitoring means, the determining means, and the adjusting means are included within a digital signal processor.

12. A transmitter for automatically calibrating erroneous modulated carrier signals, the transmitter comprising:

a memory for storing variables;

a controller for generating transmit data responsive to received data and a first of the variables;

a mixer coupled to the controller for multiplying the transmit data with a second of the variables to generate a modulating signal;

a signal generator for generating a correction signal from the transmit data;

a first phase-locked loop (PLL) for utilizing the correction signal and the modulating signal to generate a modulated carrier signal for transmission over the air;

a second PLL and a mixer for down-converting the modulated carrier signal to an intermediate frequency (IF) signal; and a monitoring circuit for comparing an instantaneous IF signal level to a previously stored value indicative of a steady state IF signal level to determine whether the instantaneous IF signal level differs from the steady state IF signal level by greater than a predetermined amount, wherein the controller calibrates at least one of the variables to compensate for error in response to the determination that the instantaneous IF signal level differs from the steady state IF signal level by greater than a predetermined amount.

13. The transmitter of claim 12, further comprising:

determining means coupled to the controller for determining whether a calibration time has arrived.

14. The transmitter of claim 13, wherein the determining means comprises:

a clock for generating values indicative of an instantaneous time of day, wherein the determining means determines that the calibration time has arrived when a stored time variable is equivalent to the instantaneous time of day.

* * * * *